United States Patent [19]
Ito

[11] Patent Number: 5,216,382
[45] Date of Patent: Jun. 1, 1993

[54] SINGLE ENDED PUSH PULL AMPLIFIER CIRCUIT

[75] Inventor: Hideo Ito, Tokyo, Japan

[73] Assignee: Pioneer Electronic Corporation, Tokyo, Japan

[21] Appl. No.: 811,008

[22] Filed: Dec. 19, 1991

[30] Foreign Application Priority Data

Dec. 27, 1990 [JP] Japan .................... 2-407776

[51] Int. Cl.⁵ .............................................. H03F 3/30
[52] U.S. Cl. .................... 330/267; 330/255; 330/260; 330/295; 330/297
[58] Field of Search .............. 330/84, 255, 260, 265, 330/267, 271, 273, 295, 297

[56] References Cited

U.S. PATENT DOCUMENTS

| | | | |
|---|---|---|---|
| 3,478,275 | 11/1969 | Walker | 330/297 |
| 3,988,691 | 10/1976 | Shih | 330/265 |
| 4,931,797 | 6/1990 | Kawaga et al. | 330/84 X |
| 5,075,636 | 12/1991 | Addis et al. | 330/260 |

Primary Examiner—James B. Mullins
Attorney, Agent, or Firm—Kane, Dalsimer, Sullivan, Kurucz, Levy, Eisele and Richard

[57] ABSTRACT

There is disclosed an amplifier circuit of the type using differential amplifiers at the preceding stage of the output stage of an SEPP (Single Ended Push Pull) circuit. This amplifier circuit is of a structure such that a power supply voltage is delivered from a second power supply circuit independent of a first power supply circuit for transistors constituting the SEPP circuit to the respective differential amplifiers. Further, the amplifier circuit featured above may be applied to an amplifier circuit arrangement including a plurality of amplifier units connected in parallel such that input terminals and output terminals are commonly connected, respectively.

11 Claims, 8 Drawing Sheets

SINGLE ENDED PUSH PULL AMPLIFIER CIRCUIT

BACKGROUND OF THE INVENTION

The present invention relates to an improvement in an amplifier circuit provided with a single ended push pull (hereinafter referred to as an SEPP) circuit.

SEPP circuits are push pull circuits operative in parallel for a load and in series for a power supply. As an example of conventional SEPP circuits, there is known a circuit in which fixed resistors are connected to emitters of respective output transistors in order to increase d.c. stabilities of the output transistors, respectively, and bias generators including a diode and a semi-fixed resistor connected in series are connected to the bases of the respective output transistors in order to give a d.c. bias to the bases of the output transistors (e.g., Japanese Patent Application Laid Open Publication No. 42540/78 Official Gazette).

However, the above mentioned conventional SEPP circuit has some drawbacks that the stability of the bias is insufficient, that an output loss is produced because resistance value of each emitter resistor cannot be small, and that there is produced a distortion larger than an allowed distortion when used as the output stage, and the like.

As an SEPP circuit to eliminate these drawbacks, there is known a circuit in which differential amplifiers are inserted between the signal input terminal and the bases of respective output transistors (e.g., see Japanese Utility Model Application Laid Open Publication No. 69121/81 Official Gazette or Japanese Utility Model Publication No. 41622/84 Official Gazette).

While the above mentioned second prior art can overcome the drawbacks with the first prior art, it a the drawback that because the power supply for delivering a power to the output transistors is adapted to double as the power supply for the differential amplifiers, it is required for the differential amplifier to have a high withstand voltage.

On the other hand, when attention is drawn to the case where a load for a low impedance (an impedance lower than a load impedance which can be driven by a single power amplifier) is driven by a plurality of power amplifiers connected in parallel using the above mentioned SEPP circuit, in the case where a negative feedback (NFB) is applied to each power amplifier, load cannot be directly connected to the output terminal thereof. In view of this, mixing resistors (or impedances) are generally connected between respective output terminals.

However, the presence of the mixing resistors leads to the problem that any output loss (so called mixing loss) in the mixing resistors may be produced. Particularly, in the case of an amplifier having a high amplification factor, any difference between outputs from respective amplifiers in the parallel driving or running is apt to occur. To prevent this, the mixing resistor is required to have a large mixing resistance value. However, an increase in the mixing resistance value would lead to a further increase of the mixing loss.

SUMMARY OF THE INVENTION

Accordingly, an object of the present invention is to provide an amplifier circuit which does not require a high withstand voltage differential amplifier in an amplifier of an SEPP circuit using differential amplifier.

Another object of the present invention is to provide an amplifier circuit which can suppress a power loss in the case of driving in parallel a plurality of amplifiers.

To achieve the above mentioned objects, an amplifier circuit in accordance with first feature of the present invention is directed to an amplifier circuit in which a second power supply for differential amplifiers and a first power supply for the output transistors are constituted independently, thus to exclude that the differential amplifier is required to have a high withstand voltage. Namely, the amplifier circuit of the first feature of the invention includes a single ended push pull circuit using at least two transistors, and differential amplifiers provided between the respective base input terminals of the transistors and the signal input terminal of the amplifier circuit, respectively, wherein a power supply voltage is delivered from a second power supply circuit independent of a first power supply circuit for the respective transistors to the respective differential amplifiers.

In accordance with the amplifier circuit featured above, a power supply voltage is delivered from the second power supply circuit to respective differential amplifiers. In this case, since an output voltage from the second power supply circuit can be freely set, it is sufficient that the power supply voltage is equal to a value at which the differential amplifier can be driven. Accordingly, a high withstand voltage differential amplifier is not required.

As the second feature of the invention, there is disclosed an actual embodiment of the second power supply circuit. Namely, in the amplifier circuit of the first feature, the second power supply circuit is comprised of a voltage source whose power supply voltage is stepped up or stepped down by an output voltage of the amplifier circuit, and which produces a voltage value having a magnitude capable of driving the base of each transistor.

In accordance with the second feature of the invention, an output voltage from the second power supply circuit is stepped up by an output voltage of the amplifier circuit and is bootstrapped. Accordingly, the second power supply circuit is only required to produce a voltage to such an extent capable of driving at least the base of the output transistor.

As the third feature of the invention, for the purpose of preventing breakage of the output transistor due to an excess in the output from the differential amplifier, limiter circuits are inserted in the respective feedback loops of the differential amplifiers, thus to limit outputs from the differential amplifiers. Namely, in an amplifier circuit including a single ended push pull circuit using at least two transistors, differential amplifiers provided between the respective base input terminals of the transistors and the signal input terminal of the amplifier circuit, respectively, and feedback loops formed between the input terminals of the respective differential amplifiers and the output terminals of the respective transistors, limiter circuits for limiting outputs from the differential amplifiers are inserted in the feedback loops, respectively.

In accordance with the third feature of the invention, output voltages from the differential amplifiers are limited by the respective limiter circuits. Thus, by setting these limit voltages so that they are in conformity with the specification of the output transistors, the output transistors can be prevented from being broken.

As the fourth feature of the invention, there is disclosed an actual embodiment of the limiter circuit. Namely, in the above mentioned amplifier circuit of the third feature, the limiter circuit includes a unidirectional conductive element connected between the output terminal of the differential amplifier and a feedback signal line in a manner to bridge thereover, and caused to be conductive by a predetermined bias voltage.

In accordance with the fourth feature of the invention, the unidirectional conductive element becomes conductive when an output voltage of the differential amplifier circuit reaches a predetermined value. As a result, a negative feedback is provided. Thus, the output voltage is clamped determined by the forward voltage of the conductive element.

As the fifth feature of the invention, in order to ensure a balance in operation between the output transistor on the push side of the SEPP circuit and the output transistor on the pull side thereof, resistors or current sources are cross connected between differential amplifiers via the second power supply circuit for the differential amplifiers. Namely, in an amplifier circuit including a single ended push pull circuit using at least two transistors, differential amplifiers provided between respective input terminals of the transistors and a signal input terminal of the amplifier circuit, respectively, and a second power supply circuit constituted independently of a power supply circuit for the respective transistors and delivering a power supply voltage to the differential amplifiers, feedback loops being formed such that either one input terminals of respective two input terminals of the differential amplifiers are connected to the signal input terminal of the amplifier circuit, and that the other input terminals are connected to the output terminals of the respective transistors, resistors or current sources are connected between the other input terminal of either one of the respective differential amplifiers and a power supply terminal for the other differential amplifier in the second power supply circuit, and between the other input terminal of the other differential amplifier and a power supply terminal for one differential amplifier in the second power supply circuit, respectively.

In accordance with the fifth feature of the invention, the other input terminal of one differential amplifier (e.g., on the push side) and the other input terminal of the other differential amplifier (e.g., on the pull side) are connected by resistors or current sources through the second power supply circuit. Thus, the balance in operation between respective output transistors on the push side and on the pull side at the time of the push pull operation becomes satisfactory.

As the sixth feature of the invention, in order to directly connect a low impedance load to the output terminal in the case of driving in parallel amplifiers using an SEPP circuit, the above mentioned third and fifth features are combined. Namely, in an amplifier circuit including a plurality of amplifier units connected in parallel such that input terminals and output terminals thereof are commonly connected, respectively, wherein each amplifier unit includes a single ended push pull circuit using at least two transistors, differential amplifiers provided between the base input terminals of the transistors and a signal input terminal of the amplifier circuit, respectively, and a second power supply circuit constituted independently of a power supply circuit for the respective transistors and delivering a power supply voltage to the differential amplifiers, feedback loops being formed such that either one input terminals of respective two input terminals of the differential amplifiers are connected to the signal input terminal of the amplifier circuit, and that the other input terminals are connected to the output terminals of the respective transistors, limiter circuits for limiting outputs from the differential amplifiers being inserted in the feedback loops, respectively, resistors or current sources are connected between the other input terminal of either one of the respective differential amplifiers and a power supply terminal for the other differential amplifier in the second power supply circuit, and between the other input terminal of the other differential amplifier and a power supply terminal for one differential amplifier in the second power supply circuit, respectively.

In accordance with the sixth feature of the invention, since the amplifier circuit of the fifth feature of the invention is used as each amplifier unit, the balance in the push pull operation becomes satisfactory, and unevennesses between the amplification degrees of respective amplifier units are reduced. Thus, load can be directly connected to the output terminal without using a mixing resistor as in the prior art.

DESCRIPTION OF THE PREFERRED EMBODIMENTS

Preferred embodiments of the present invention will now be described with reference to the attached drawings.

(i) First embodiment

Figure 1:
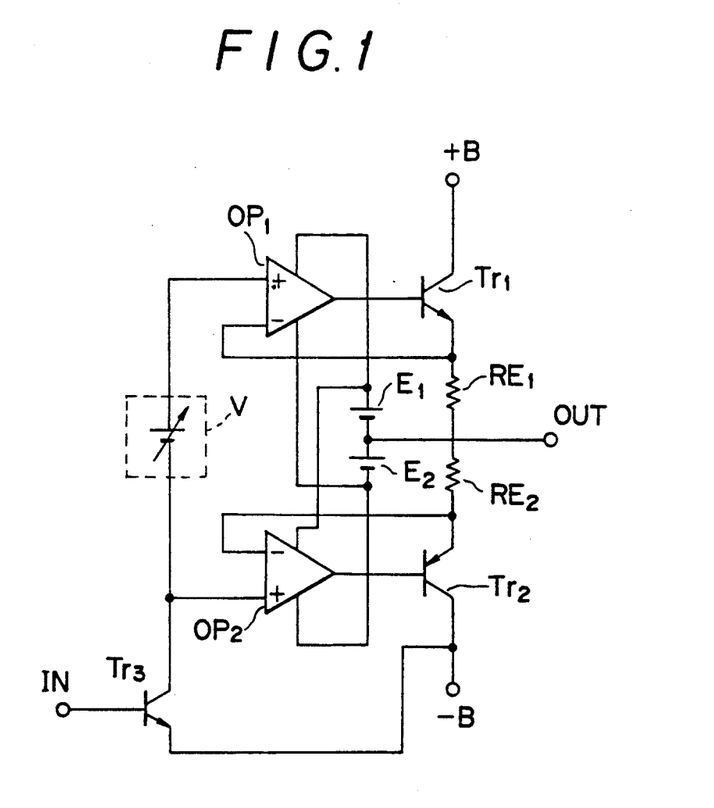
FIG. 1 is a circuit diagram showing a first embodiment of an amplifier circuit according to the present invention.

Initially referring to FIG. 1, there is shown a first embodiment of an amplifier circuit according to the present invention. The output stage of the amplifier circuit is constructed as an SEPP circuit comprised of a transistor $T_{r1}$ (NPN type bipolar transistor) on the push side and a transistor $T_{r2}$ (PNP type bipolar transistor) on the pull side. Emitter resistors $RE_1$ and $RE_2$ are connected to the emitters of the transistors $T_{r1}$ and $T_{r2}$, respectively, and an output terminal OUT is drawn out from the junction of the emitter resistor $RE_1$ and the emitter resistor $RE_2$. Operational amplifiers $OP_1$ and OP$_2$ for driving the transistors T$_{r1}$ and T$_{r2}$ are connected to the bases of the transistors T$_{r1}$ and T$_{r2}$, respectively. An input signal from the input terminal IN is given to the non-inverting input terminal of the operational amplifier OP$_1$ as a differential amplifier means through a transistor T$_{r3}$ and a d.c. bias voltage generator V, and is directly given to the non-inverting input terminal of the operational amplifier OP$_2$ as a differential amplifier means. Further, inverting input terminals of the operational amplifiers OP$_1$ and OP$_2$ are connected to the emitters of corresponding transistors T$_{r1}$ and T$_{r2}$, respectively. Thus, two feedback loops are formed with respect to the two transistors T$_{r1}$ and T$_{r2}$, respectively.

On the other hand, a voltage from a power supply +B on a higher potential side is delivered to the collector of the transistor T$_{r1}$, and a voltage from a power supply −B on a lower potential side is delivered to the collector of the transistor T$_{r2}$. Further, power supply voltages for the operational amplifiers OP$_1$ and OP$_2$ are delivered from voltage sources E$_1$ and E$_2$, respectively.

These voltage sources E$_1$ and E$_2$ are constituted by a power supply circuit independent of the power supplies +B and −B. Since the junction of the voltage sources E$_1$ and E$_2$ is connected to the output terminal OUT, voltage values level shifted by an output voltage appearing on the output terminal OUT is given. Namely, a voltage obtained by adding a voltage value of the voltage source E$_1$ to an output voltage on the output terminal OUT is given to the positive side power supply terminal of the operational amplifier OP$_1$, and a voltage value obtained by subtracting a voltage value of the voltage source E$_2$ from an output voltage on the output terminal OUT is given to the negative side power supply terminal of the operational amplifier OP$_1$. The same also applies to the operational amplifier OP$_2$.

In this way, high voltages like power supplies +B and −B delivered to the transistors T$_{r1}$ and T$_{r2}$ are not delivered to the respective power supply terminals of the operational amplifiers OP$_1$ and OP$_2$, but voltages from voltage sources E$_1$ and E$_2$ stepped up or stepped down by power supplies +B and −B are delivered thereto. At this time, since output voltages from the operational amplifiers OP$_1$ and OP$_2$ are determined to be capable of driving the bases of the transistors T$_{r1}$ and T$_{r2}$, it is enough that the power supply voltage for the operational amplifiers OP$_1$ and OP$_2$ has a relatively low voltage. Accordingly, operational amplifiers having a withstand voltage lower than a withstand voltage with respect to the power supplies +B and −B can be used as the respective operational amplifiers OP$_1$ and OP$_2$. As a result, typical operational amplifiers may be used for this purpose. Namely, it is unnecessary to use an operational amplifier having a particularly high withstand voltage. As an example of the circuit constant, in the case where, e.g., RE$_1$ is assumed to be 0.1 ohms and Iout is assumed to be 50A, it is sufficient that VRE is equal to 5 volts, and therefore E$_1$ and E$_2$ are equal to ±10 volts.

As an actual example of the voltage sources E$_1$ and E$_2$, although not shown, such voltage sources may be prepared by dividing voltages of the power supplies +B and −B by using resistors, etc., or may be prepared by a rectified output of a power supply circuit by using resistors.

(ii) Second embodiment

Figure 2:
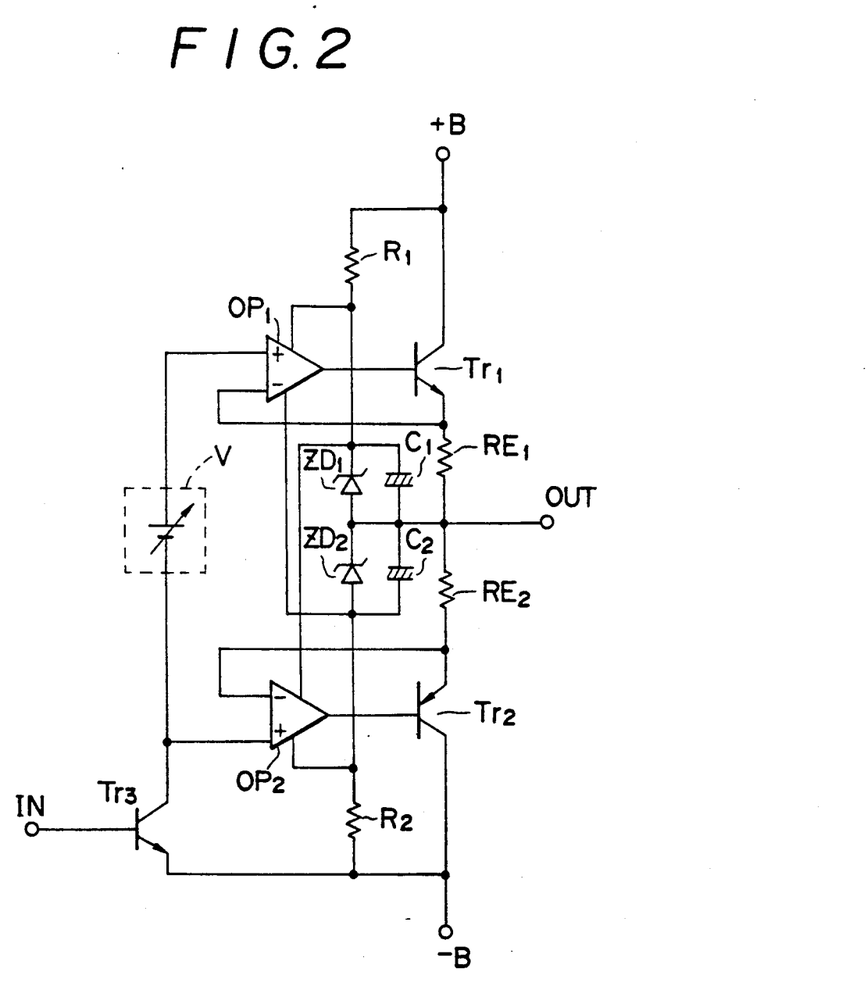
FIG. 2 is a circuit diagram showing a second embodiment of an amplifier circuit according to the present invention.

Referring to FIG. 2, there is shown a second embodiment. In the second embodiment, there is shown one form of the voltage sources E$_1$ and E$_2$ shown in FIG. 1 wherein the voltage source E$_1$ is comprised of a resistor R$_1$, a Zener diode ZD$_1$ and a capacitor C$_1$, and the voltage source E$_2$ is comprised of a resistor R$_2$, a Zener diode ZD$_2$ and a capacitor C$_2$. In the example shown in FIG. 2, a voltage between the power supply +B and the power supply −B are divided by the resistor R$_1$, the Zener diodes ZD$_1$ and ZD$_2$, and the resistor R$_2$. Accordingly, a voltage obtained by adding a divided voltage of the Zener diode ZD$_1$ to an output voltage on the output terminal OUT is applied to the positive side power supply terminal of the operational amplifier OP$_1$. In contrast, a voltage obtained by subtracting a divided voltage of the Zener diode ZD$_2$ from an output voltage on the output terminal OUT is applied to the negative side power supply terminal of the operational amplifier OP$_2$. Thus, the function similar to that in the example of FIG. 1 is realized. Since other configurations are the same as that in FIG. 1, the same reference numerals are attached to the same portions, respectively, and their explanation will be omitted.

(iii) Third embodiment

Figure 3:
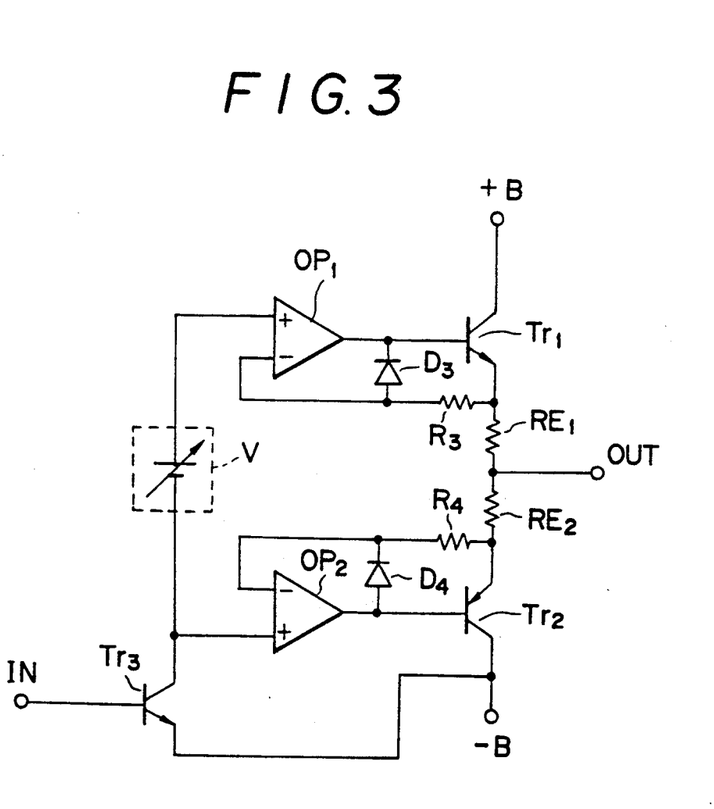
FIG. 3 is a circuit diagram showing a third embodiment of an amplifier circuit according to the present invention.

Referring to FIG. 3, there is shown a third embodiment. The third embodiment relates to an improvement in the prior art, the first embodiment (FIG. 1) and the second embodiment (FIG. 2).

By taking, e.g., an example of the case of the first embodiment (FIG. 1), the problem encountered therewith will now be described. In the case of the circuit shown in FIG. 1, when a positive (push) output is provided at the time of the push pull operation, a collector current of the transistor T$_{r1}$ increases, and a collector current of the transistor T$_{r2}$ decreases. At this time, in the case where the output voltage is in a range of the class A operation, there is no problem. However, in the case where the output voltage exceeds the range of the class A operation, although the collector current of the transistor T$_{r2}$ becomes equal to zero, since a feedback from the emitter of the transistor T$_{r2}$ is provided for the inverting input terminal of the operational amplifier OP$_2$, the operational amplifier OP$_2$ increases an output voltage in order to further decrease the collector current of the transistor T$_{r2}$. As a result, the operational amplifier OP$_2$ provides an output up to a maximum output voltage which can be outputted to the positive side. This positive output voltage will serve as a reverse bias with respect to the base of the transistor T$_{r2}$. Accordingly, in the case of the class B operation or the class AB operation above the range of the class A operation, there is the possibility that the transistor T$_{r2}$ may be broken by a reverse bias as described above. At this time, the operational amplifier OP$_2$ is also brought into an unstable state. The above mentioned circumstances similarly apply to the transistor T$_{r1}$ and the operational amplifier OP$_1$.

The third embodiment aims at solving inconveniences as described above. An amplifier circuit of this embodiment is shown in FIG. 3.

As shown in FIG. 3, a diode D$_3$ is inserted in a direction of the polarity as shown into the feedback loop from the transistor T$_{r1}$ to the operational amplifier OP$_1$, and a resistor R$_3$ is inserted thereinto. Similarly, a diode D$_4$ is inserted in a direction of the polarity as shown into the feedback loop from the transistor T$_{r2}$ to the operational OP$_2$, and a resistor R$_4$ is inserted thereinto. The diode D$_3$ and the resistor R$_3$, and the diode D$_4$ and the resistor R$_4$ constitute limiter circuits, respectively. Since other configurations are similar to those in FIG. 1, the same reference numerals are attached to the same portions, respectively, and their explanation will be omitted.

In accordance with such a configuration, when, e.g., an output from the operational amplifier $OP_2$ shifts to the positive side, positive and negative biases are applied to the anode and the cathode of the diode $D_4$, respectively. Thus, the diode $D_4$ becomes conductive. As a result, a negative feedback is applied to the operational amplifier $OP_2$ through the diode $D_4$, so the output voltage from the operational amplifier $OP_2$ is locked at a value VF of a forward voltage drop of the diode $D_4$ and is limited. Accordingly, this embodiment makes it possible to prevent an excessive output in the case where the operational amplifier $OP_1$ or $OP_2$ exceeds the range of the class A operation, and to apply the amplifier circuit disclosed in the first embodiment, etc. to the class B amplifier and/or the class AB amplifier.

(iv) Fourth embodiment

Figure 4:
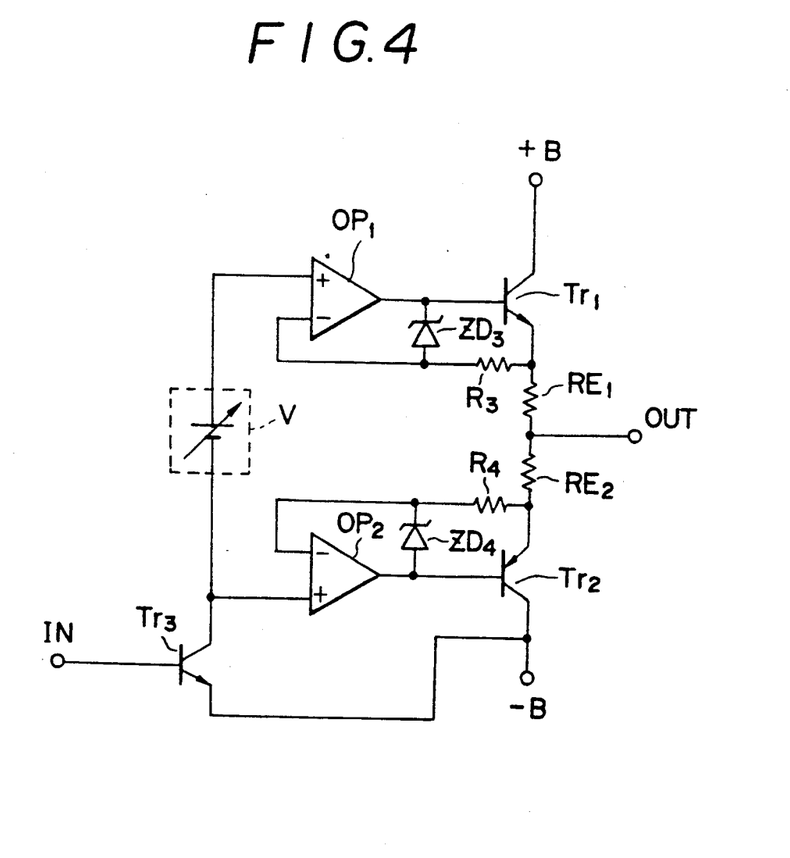
FIG. 4 is a circuit diagram showing a fourth embodiment of an amplifier circuit according to the present invention.

Referring to FIG. 4, there is shown an amplifier circuit of a fourth embodiment. The fourth embodiment relates to an improvement in the third embodiment (FIG. 3).

Namely, the amplifier circuit of the third embodiment shown in FIG. 3 is a circuit capable of allowing a large load current to flow. However, if the load is in a short circuited state, an extremely large load current flows, resulting in the possibility that the transistors $T_{r1}$ and $T_{r2}$ of the output stage may be broken. In view of this, an object of this embodiment is to provide an ability of preventing breakage of the transistors $T_{r1}$ and $T_{r2}$ of the output stage, and an ability of setting an output current to a reasonable value.

As shown in FIG. 4, Zener diodes $ZD_3$ and $ZD_4$ are used in place of diodes $D_3$ and $D_4$ shown in FIG. 3, respectively. These Zener diodes $ZD_3$ and $ZD_4$ are rectifier elements having a directional property, but have such a characteristic to become reverse conductive when a voltage thereacross reaches a predetermined Zener voltage in a reverse direction.

In FIG. 4, when an output voltage on the output terminal OUT becomes excessive, an output voltage of the operational amplifier $OP_1$ becomes too large to reach a Zener voltage, a negative feedback is applied to the operational amplifier $OP_1$ through the Zener diode $ZD_3$, and a positive output of the operational amplifier $OP_1$ is clamped at a Zener voltage of the Zener diode $ZD_3$. As a result, a voltage more than that Zener voltage is not applied to the base of the transistor $Tr_1$, thus making it possible to prevent that an excessive load current flows in the transistor $T_{r1}$, leading to breakage of the transistor $T_{r1}$. Further, when there is employed an approach to set the base voltage of the transistor $T_{r1}$ by the method of selecting a Zener voltage of the Zener diode $ZD_1$ so that it is equal to a suitable value, the method of inserting in series a suitable voltage dividing resistor, or the like, an output current of the transistor $T_{r1}$ can be set to an arbitrary value.

(v) Fifth embodiment

Figure 5:
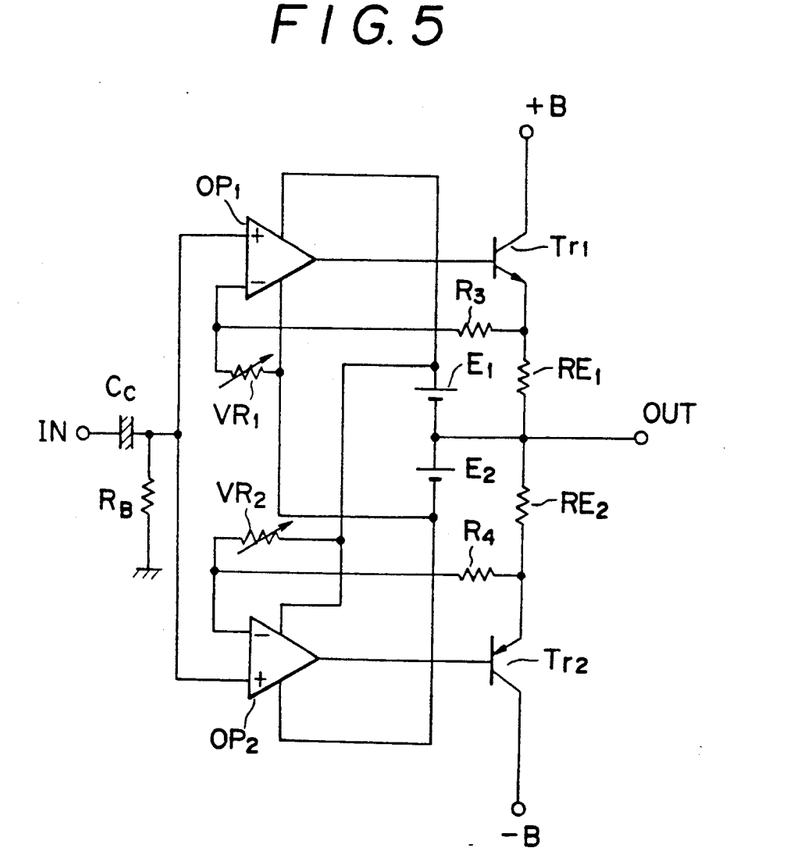
FIG. 5 is a circuit diagram showing a fifth embodiment of an amplifier circuit according to the present invention.

Referring to FIG. 5, there is shown an amplifier circuit of a fifth embodiment. The amplifier circuit of the fifth embodiment aims at preventing an unbalanced operation of the operational amplifiers $OP_1$ and $OP_2$ by a d.c. bias voltage generator V.

Namely, in the amplifier circuit disclosed in any one of the first to fourth embodiments, a d.c. bias voltage generator V is inserted in the signal input path of the operational amplifier $OP_1$. In the case where, e.g., the amplifier shown in FIG. 1 is used as a power amplifier, the signal input to the non-inverting input terminal of the operational amplifier $OP_1$ is carried out through the d.c. bias voltage generator V, whereas the signal input to the operational amplifier $OP_2$ is directly carried out. For this reason, there occurs an unbalance of an input signal between the operational amplifiers $OP_1$ and $OP_2$. This unbalance will lead to an unbalance of the push pull operation of the transistors $T_{r1}$ and $T_{r2}$. An example of an amplifier circuit constructed in order to eliminate such an inconvenience is shown in FIG. 5.

In FIG. 5, the negative side of the voltage source $E_2$ is connected to the inverting input terminal side of the operational amplifier $OP_1$ through a variable resistor (or a semi-fixed resistor) $VR_1$, and the positive side of the voltage source $E_1$ is connected to the inverting input variable resistor $VR_2$. By establishing connection in this terminal side of the operational amplifier $OP_2$ through a way, a d.c. voltage of the voltage source $E_2$ is applied to the operational amplifier $OP_1$ through the variable resistor $VR_1$, and a d.c. voltage of the voltage source $E_1$ is applied to the operational amplifier $OP_2$ through the variable resistor $VR_2$. Thus, this circuit configuration can be caused to function as a d.c. bias voltage generator to deliver a voltage corresponding to a voltage generated from the d.c. bias voltage generator V. As the result of the fact that connections of the inverting input terminals of the operational amplifiers $OP_1$ and $OP_2$ are carried out as stated above, it is possible to directly connect the noninverting input terminals of the operational amplifiers $OP_1$ and $OP_2$ with each other to evenly give an input signal from the input terminal IN to the operational amplifiers $OP_1$ and $OP_2$. This can effectively prevent an unbalance operation which might be produced between the operational amplifiers $OP_1$ and $OP_2$. It is to be noted that if suitable values are selected as the respective resistance values of the variable resistors $VR_1$ and $VR_2$, these resistors may use fixed resistors, respectively. Other circuit configurations are the same as those in FIG. 1.

(vi) Sixth embodiment

Figure 6:
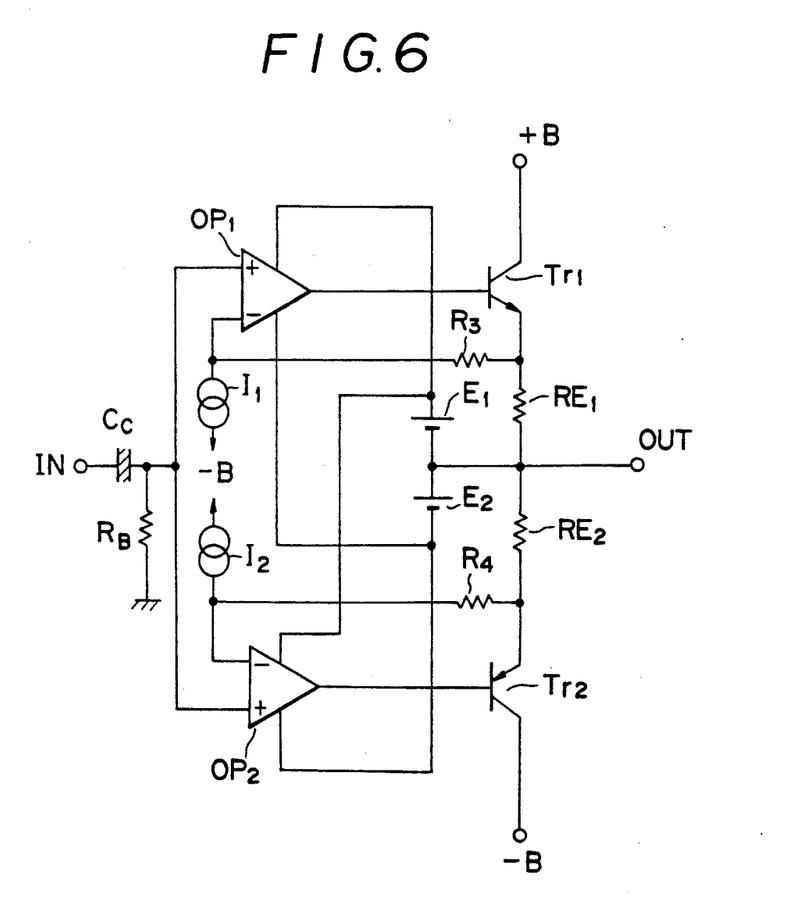
FIG. 6 is a circuit diagram showing a sixth embodiment of an amplifier circuit according to the present invention.

Referring to FIG. 6, there is shown an amplifier circuit of a sixth embodiment. The amplifier circuit of the sixth embodiment is characterized in that current sources $I_1$ and $I_2$ are used in place of variable resistors VR1 and $VR_2$ in the amplifier circuit of the fifth embodiment (FIG. 5), respectively. By connecting current sources $I_1$ and $I_2$ between the inverting input terminals of the operational amplifiers $OP_1$ and $OP_2$ and the power supply -B in this way, it is possible to give a d.c. bias in conformity with a current flowing in each operational amplifier. In adjustment, the current sources $I_1$ and $I_2$ are constructed as a variable current source to determine optimum values thereafter to perform stabilized operations as respective constant current sources. Other circuit configurations are the same as those of the fifth embodiment.

(vii) Seventh embodiment

A seventh embodiment of an amplifier circuit constructed to drive in parallel a plurality of amplifiers will now be described.

Prior to the description of this embodiment, a conventional amplifier circuit corresponding thereto will be first described with reference to FIG. 8. It is now assumed that amplifiers $A_{01}$ to $A_{0n}$ to which a negative feedback (NFB) is applied are connected in parallel to drive speakers $SP_1$ to $SP_n$. In the case where each load impedance is lower than the impedance at which each of individual amplifiers can drive, since output terminals of respective amplifiers $A_{01}$ to $A_{0n}$ cannot be directly connected in parallel, it was required to connect mixing resistors $R_{m1}$ to $R_{mn}$ for adjustment of impedance between respective output terminals of the amplifiers $A_{01}$ to $A_{0n}$. However, connecting mixing resistors $R_{m1}$ to $R_{mn}$ to the output terminal will result in output losses (mixing losses) produced in the mixing resistors $R_{m1}$ to $R_{mn}$. Further, particularly in the case where amplifiers $A_{01}$ to $A_{0n}$ have a high amplification degree, since unevennesses of the amplification degrees are apt to occur between respective amplifiers $A_{01}$ to $A_{0n}$, it is necessary to use mixing resistors $R_{m1}$ to $R_{mn}$ having a large value. In that case, the mixing loss becomes a considerably large value. In view of this, as the amplifier circuit capable of eliminating such an inconvenience, an amplifier circuit of the seventh embodiment is disclosed in FIG. 7.

Figure 7:
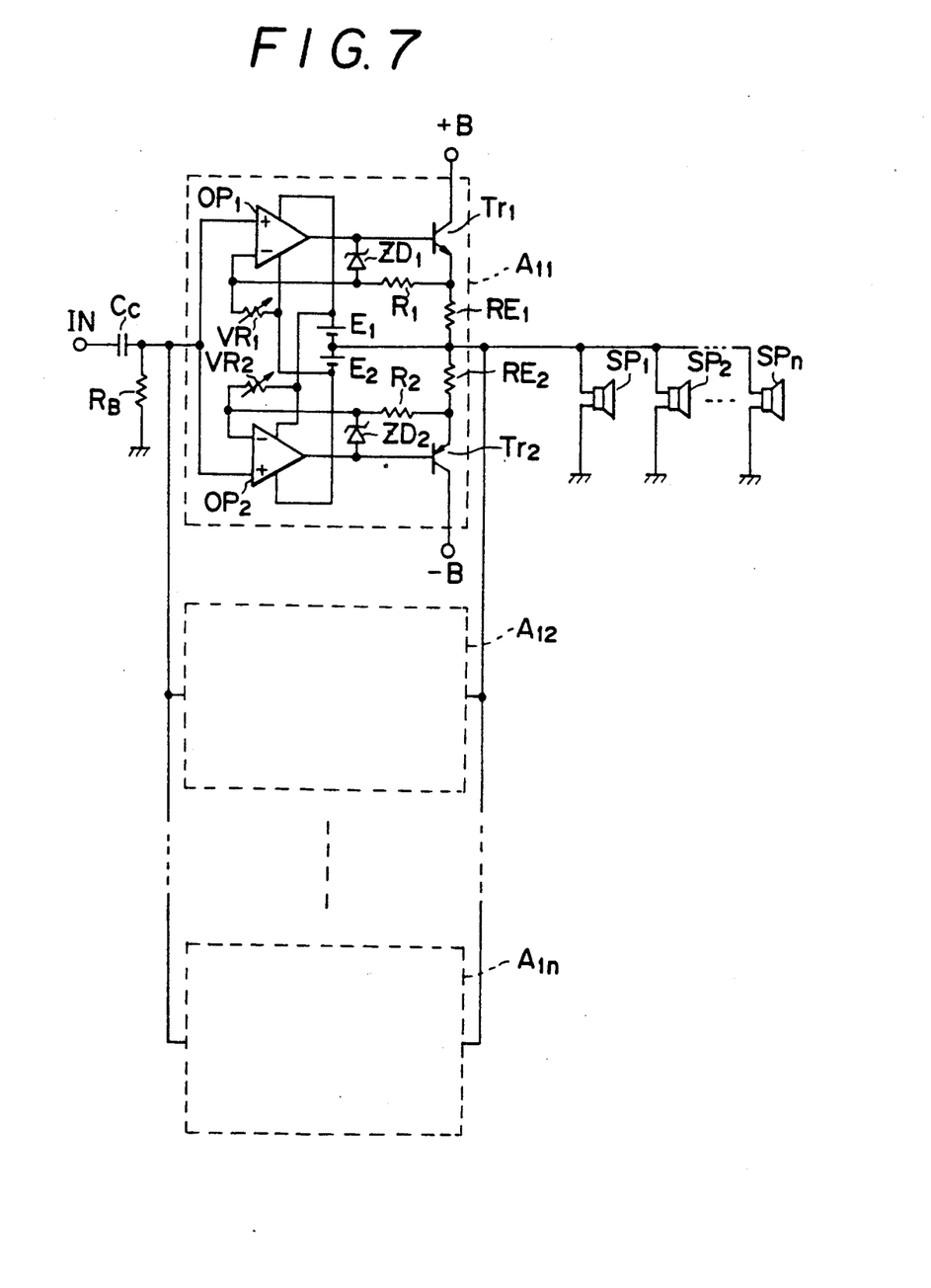
FIG. 7 is a circuit diagram showing the seventh embodiment of an amplifier circuit according to the present invention.
Figure 8:
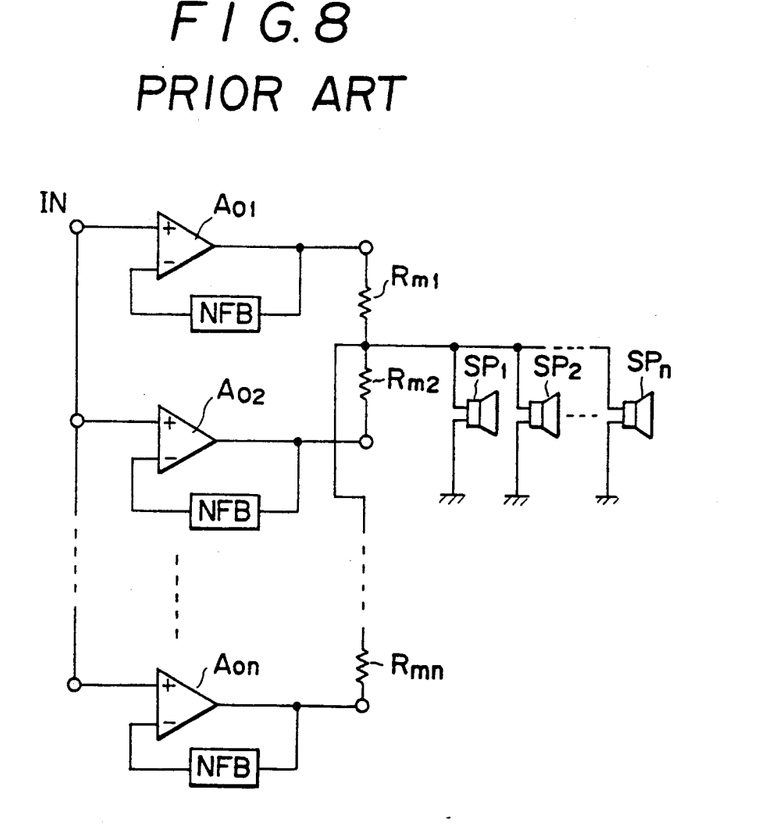
FIG. 8 is a circuit diagram showing a conventional amplifier circuit corresponding to a seventh embodiment of the present invention.

As shown in FIG. 7, in the seventh embodiment, the amplifier circuit of the fifth embodiment (FIG. 5) is applied to respective amplifiers $A_{11}$ to $A_{1n}$, wherein input terminals and output terminals of the respective amplifiers $A_{11}$ to $A_{1n}$ are directly connected. The configurations and the operations of the respective amplifiers $A_{11}$ to $A_{1n}$ themselves are as shown in FIG. 5 and therefore their explanation will be omitted.

By using the amplifier circuit shown in FIG. 5 as the amplifiers $A_{11}$ to $A_{1n}$ in this way, mixing resistors $R_{m1}$ to $R_{mn}$ which were required in the prior art become unnecessary. As a result, occurrence of mixing loss can be prevented. Namely, since the amplifier circuit shown in FIG. 5 is a $R_{mn}$ which were required in the prior art become unnecessary. As a result, occurrence of mixing loss can be prevented. Well balanced and stable amplifier capable of directly connecting the input terminal, unevennesses of the amplification degrees between respective amplifiers $A_{11}$ to $A_{1n}$ becomes extremely less. Accordingly, the output terminal can be directly connected. Further, since it is sufficient to connect in parallel amplifiers ($A_{11}$ to $A_{1n}$) corresponding to loads (speakers $SP_1$ to $SP_n$) as they are, it is possible to construct a widely applicable and flexible amplifier circuit of the parallel drive type.

As described above, in accordance with the present invention, since the second power supply circuit is used, it is possible to provide an amplifier circuit which can be stably operated without using an amplifier having a particularly large withstand voltage as the differential amplifier circuit arranged at the preceding stage of the SEPP circuit.

Further, in accordance with the present invention, since the limiter circuit is employed, it is possible to prevent breakage of the output transistor due to an excessive output of the differential amplifier arranged at the preceding stage of the SEPP circuit.

Furthermore, in accordance with the present invention, since a voltage is given from the second power supply circuit to the input terminal of the differential amplifier at the preceding stage of the SEPP circuit, inputs of respective differential amplifier circuits can be directly connected. Thus, an amplifying operation such that an amplification on the push side and that on the pull side are well balanced can be performed.

In addition, in accordance with the present invention, mixing resistors at the output terminals of respective amplifiers become unnecessary, thus making it possible to prevent occurrence of power loss of output.

The present invention may be embodied in other specific forms without departing from the spirit or essential characteristics thereof. The present embodiments are therefore to be considered in all aspects as illustrative and not restrictive, the scope of the invention being indicated by the appended claims rather than by the foregoing description, and all changes which come within the meaning and range of equivalency of the claims are therefore intended to be embraced therein.

What is claimed is:

1. A single ended push pull amplifier circuit comprising:

single ended push pull circuit means using at least two transistors;

differential amplifier means provided between base input terminals of said transistors and a signal input terminal of said amplifier circuit to operate the transistors;

first power supply circuit means for supplying a power to the transistors; and second power supply circuit means provided independently of the first power supply circuit means and connected with a signal output terminal of said single ended push pull circuit means for adding a prescribed voltage onto an output voltage of said signal output terminal and supplying a power of the prescribed voltage added on said output voltage to the differential amplifier means.

2. A single ended push pull amplifier circuit as set forth in claim 1, wherein said prescribed voltage of said second power supply circuit means is set to be a voltage value having a magnitude capable of driving a base of each of said transistors.

3. A single ended push pull amplifier circuit as set forth in claim 1, further comprising feedback loop circuit means formed between input terminals of said differential amplifier means and output terminals of said transistors, respectively, said feedback loop circuit means having limiter circuit means for limiting outputs from the differential amplifier means.

4. A single ended push pull amplifier circuit as set forth in claim 3, wherein said limiter circuit means includes a unidirectional conductive element which is provided on a feedback signal line and which is conductive by a predetermined bias voltage.

5. A single ended push pull amplifier circuit as set forth in claim 4, wherein said unidirectional conductive element comprises a diode.

6. A single ended push pull amplifier circuit as set forth in claim 5, wherein said diode is a Zener diode.

7. A single ended push pull amplifier circuit as set forth in claim 1, further comprising feedback loop circuit means formed between each transistor and each differential amplifier means and each feedback loop circuit means having a resistor between an emitter of each transistor and a variable resistor connected between an input terminal of one differential amplifier and a power supply terminal for the other differential amplifier in said second power supply circuit means.

8. A single ended push pull amplifier circuit as set forth in claim 1, further comprising feed back loop circuit means formed between each transistor and each differential amplifier means, and each feedback loop circuit means having a resistor between an emitter of each transistor and a current source between an input terminal of each differential amplifier and the resistor.

9. A single ended push pull amplifier circuit comprising:

single ended push pull circuit means using at least two transistors;

differential amplifier means provided between base input terminals of said transistors and a signal input terminal of said amplifier circuit to operate the transistors;

first power supply circuit means for supplying a power to the transistors; and second power supply circuit means connected with a signal output terminal of said single ended push pull circuit means for adding a prescribed voltage onto an output voltage of said signal output terminal and supplying a power of the prescribed voltage added on said output voltage to the differential amplifier means, wherein said second power supply circuit means comprises dividing means for dividing a voltage of said first power supply circuit means, a divided voltage divided by said dividing means being added on said output voltage and applied to differential amplifier means.

10. A single ended push pull amplifier circuit as set forth in claim 9, wherein said dividing means comprises a resistor connected to the first power supply circuit means, and said second power supply circuit means further comprises a Zener diode and a capacitor, said Zener diode and the capacitor being provided in parallel between said signal output terminal and said differential amplifier means and connected to the resistor so as to add said output voltage therethrough onto the voltage divided by said resistor.

11. A single ended push pull amplifier circuit including a plurality of amplifier units connected in parallel such that input terminals and output terminals thereof are commonly connected, respectively, wherein each of said amplifier units includes single ended push pull circuit means using at least two transistors, differential amplifier means provided between base input terminals of said transistors and a single input terminal of said amplifier circuit to operate the transistors, first power supply circuit means for supplying a power to the transistors, and second power supply circuit means provided independently of the first power supply circuit means for supplying a power to the differential amplifier means, feedback loop being formed such that one input terminals of respective two input terminals of said differential amplifier means are connected to said signal input terminal of said amplifier circuit, and that the other input terminals are connected to the output terminals of said respective transistors, limiter circuits for limiting outputs from said differential amplifiers being inserted in said feedback loops, respectively.

* * * * *